United States Patent [19]

Fukuda et al.

[11] Patent Number: 5,559,678
[45] Date of Patent: Sep. 24, 1996

[54] ELECTRONIC DEVICE HOUSING

[75] Inventors: Hirofumi Fukuda; Kazuo Hatori; Kazumi Yamada, all of Kawasaki; Toshiaki Nogiri, Fukuoka; Kozo Mori, Kawasaki, all of Japan

[73] Assignee: Fujitsu Limited, Kanagawa, Japan

[21] Appl. No.: 542,350

[22] Filed: Oct. 12, 1995

[30] Foreign Application Priority Data

Mar. 16, 1995 [JP] Japan .................................. 7-057153

[51] Int. Cl.$^6$ .................................................. H05K 9/00
[52] U.S. Cl. .................. 361/818; 361/796; 361/816; 361/802; 174/35 R; 257/659
[58] Field of Search ...................... 361/752, 756, 361/796, 802, 800, 816, 818; 174/35 R; 211/41; 439/374, 61, 377, 325, 108, 109; 206/334; 257/659, 660

[56] References Cited

U.S. PATENT DOCUMENTS

| 4,631,641 | 12/1986 | Brombal et al. | 361/424 |
| 4,744,006 | 5/1988 | Duffield | 361/413 |
| 4,780,570 | 10/1988 | Chuck | 174/35 GC |
| 5,118,904 | 6/1992 | Nguyenngo | 174/35 GC |

FOREIGN PATENT DOCUMENTS

| 63-156398 | 6/1988 | Japan . |
| 256494 | 4/1990 | Japan . |
| 2110394 | 9/1990 | Japan . |
| 520382 | 3/1993 | Japan . |

Primary Examiner—Leo P. Picard
Assistant Examiner—Y. Whang

[57] ABSTRACT

A box-shaped rack forming an electronic device housing has a plurality of guide grooves for guiding upper and lower edges of electronic circuit packages. A plurality of dummy surface plates are pivotably mounted on a front opening portion of the rack and arranged side by side. Each dummy surface plate is biased by a spring, so that when the electronic circuit package is not inserted in the rack, the dummy surface plate is kept in abutment against the inner surface of the rack to shield a part of the front opening portion of the rack. When the electronic circuit package is inserted into the rack, the dummy surface plate is pushed by the electronic circuit package to pivot inward of the rack, and is finally replaced in position by the package surface plate mounted on the electronic circuit package. When the electronic circuit package is removed from the rack, the dummy surface plate is reversely pivoted to restore an original position and again shield the part of the front opening portion of the rack. Accordingly, even when the electronic circuit package is inserted or exchanged during the operation of the electronic device, the occurrence of electromagnetic interference and the reduction in cooling efficiency can be prevented to thereby improve the efficiency of working such as exchanging of the electronic circuit package.

8 Claims, 14 Drawing Sheets

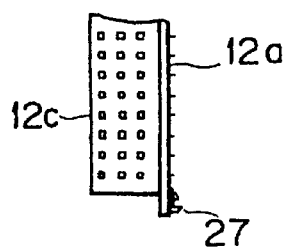
FIG. 12A
FIG. 12B
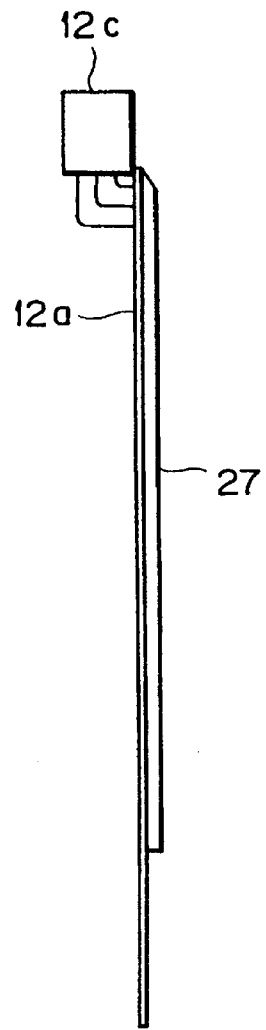
FIG. 12C
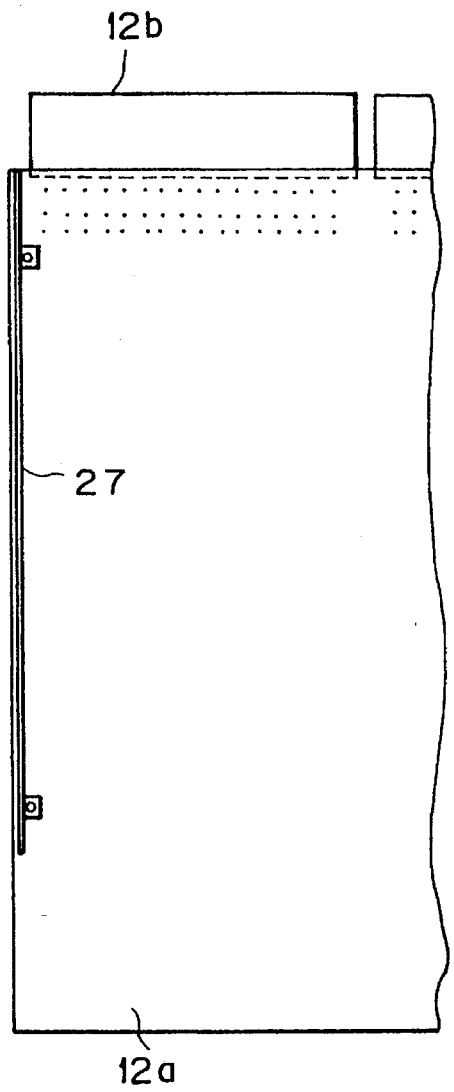

ELECTRONIC DEVICE HOUSING

BACKGROUND OF THE INVENTION

1. Field of the Invention

The present invention relates to an electronic device housing for storing a plurality of electronic circuit packages each formed by mounting a plurality of electronic components on a printed wiring board.

2. Description of the Related Art

As a structure of an electronic device such as a communication device, computer, or switching device, it is known that a plurality of electronic circuit packages each formed by mounting electronic components such as ICs and LSIs on a printed wiring board are inserted into an electronic device housing having a back board and are plug-in connected to the back board. In the electronic device having such a structure, the electronic circuit packages are sometimes exchanged or added during the operation of the device for the purpose of maintenance or addition of function. In performing such working, it is necessary to prevent a reduction in cooling efficiency and improve the working efficiency. Further, it is also necessary to take electromagnetic shielding measures for preventing electromagnetic interference (EMI). Further, in response to an increase in size of the electronic device having such a structure, it is also necessary to prevent the deflection or deformation of the electronic device housing.

Referring first to FIGS. 13 and 14, there will be described an electronic device configured by using a conventional electronic device housing. The electronic device is generally composed of an electronic device housing 1 having a multi-stage structure and a plurality of electronic circuit packages 2 inserted in each stage of the electronic device housing 1 so as to be arranged in parallel. Each electronic circuit package 2 is generally composed of a printed wiring board 2a and a plurality of electronic components 2b such as ICs, LSIs, and a connector mounted on the printed wiring board 2a. The electronic device housing 1 is generally composed of a rack 3 having a unit frame and panels mounted on the unit frame except its front side, and a plurality of integral surface plates 4 for respectively shielding the front openings of all stages of the rack 3. Each integral surface plate 4 is detachably mounted on the rack 3 by screws 4a or the like. The electronic device housing 1 has in its each stage a plurality of pairs of upper and lower guide grooves 5. The upper and lower side edges of the printed wiring board 2a of each electronic circuit package 2 is guided by the guide grooves 5 in inserting the electronic circuit package 2 into the rack 3, and each electronic circuit package 2 is plug-in connected to a back board (not shown) mounted on a rear portion of the electronic device housing 1. In the following description, a plurality of sections of the electronic device housing 1 into which the electronic circuit packages 2 are inserted will be referred to also as slots.

A cooling fan is stored in an upper portion 6 of the electronic device housing 1. Reference numeral 7 denotes a reinforcing plate for preventing the deflection or deformation of the rack 3, which causes trouble in inserting or removing each electronic circuit package 2 or causes application of undue pressure to the electronic circuit packages 2 stored in the rack 3. In a normal operation, the integral surface plates 4 are mounted on the rack 3 to thereby make an electromagnetically shielded condition of the electronic device housing 1, and the cooling fan is operated to intake the outside air from the lowermost portion of the electronic device housing 1 as shown by an arrow A in FIG. 14, thereby preventing a rise in temperature inside the electronic device housing 1 due to heat generation from the electronic circuit packages 2. When the need for exchange, addition, or removal (which will be hereinafter referred to as exchange or the like) of any electronic circuit package 2 arises for maintenance, addition of function, etc., the corresponding integral surface plate 4 is removed to perform the working of exchange or the like by inserting or removing the electronic circuit package 2. Thereafter, the removed integral surface plate 4 is mounted again.

Referring next to FIGS. 15 and 16, there will be described an electronic device configured by using another conventional electronic device housing. Substantially the same parts as those shown in FIGS. 13 and 14 will be denoted by the same reference numerals, and the description thereof will be omitted. In this conventional electronic device housing, the integral surface plates 4 as shown in FIGS. 13 and 14 are not employed, but a package surface plate 8 is mounted on each electronic circuit package 2, and a blank plate 9 having a configuration similar to that of each electronic circuit package 2 or each package surface plate 8 is inserted in or mounted at each slot where the electronic circuit package 2 is not inserted.

The working of exchange or the like of the electronic circuit packages for maintenance, addition of function, etc. of the electronic device is sometimes performed while the electronic device is being operated. In this case, the conventional structure shown in FIGS. 13 and 14 has a problem such that the removal of the integral surface plate 4 causes electromagnetic interference due to cancellation of the electromagnetically shielded condition, or causes trouble due to insufficient cooling by a change in flow path of the cooling air as shown by an arrow B in FIG. 14. According to the conventional structure shown in FIGS. 15 and 16, the area of cancellation of the shielded condition through the front opening of the rack in exchanging or the like of the electronic circuit packages can be suppressed as compared with the conventional structure shown in FIGS. 13 and 14, thus preventing the occurrence of electromagnetic interference and the reduction in cooling efficiency to some extent; however, there is yet a room for improvement.

Further, in each of the above conventional structures, the integral surface plate or the blank plate must be removed and mounted in exchanging or the like of the electronic circuit package, causing an increase in number of working steps and a reduction in working efficiency. Further, while the reinforcing plate for preventing the deflection or deformation of the electronic device housing is mounted in each conventional structure, the presence of the reinforcing plate decreases the number of the electronic circuit packages allowed to be inserted, causing a hindrance to size reduction of the device. Further, the deflection or deformation of the electronic device housing cannot be enough prevented only by the reinforcing plate.

SUMMARY OF THE INVENTION

It is therefore an object of the present invention to provide an electronic device housing which can enough prevent the occurrence of electromagnetic interference and the reduction in cooling efficiency when the need for exchange or the like of the electronic circuit package arises during the operation of the device.

It is another object of the present invention to provide an electronic device housing which can improve the efficiency of working such as exchanging of the electronic circuit package.

It is a further object of the present invention to provide an electronic device housing which can reliably prevent the deflection or deformation of the housing without hindering the size reduction of the device.

In accordance with an aspect of the present invention, there is provided an electronic device housing for storing a plurality of electronic circuit packages, comprising a box-shaped rack having a plurality of guide grooves for guiding opposite side edges of the electronic circuit packages, and having an opening for allowing insertion and removal of the electronic circuit packages; a package surface plate mounted on each of the electronic circuit packages, for shielding a partial region of the opening of the rack when one of the electronic circuit packages is inserted into the rack as being guided by the guide grooves; and a plurality of dummy surface plates pivotably mounted on the rack, each of the dummy surface plates being pivoted inward of the rack by a pushing force applied to the dummy surface plate from one of the electronic circuit packages when the electronic circuit package is inserted into the rack as being guided by the guide grooves, whereas each of the dummy surface plates being pivoted so as to shield the partial region of the opening of the rack having been closed by the package surface plate when the electronic circuit package is removed from the rack as being guided by the guide grooves. A plurality of rod members for respectively pivotably supporting the dummy surface plates may be mounted to the rack in the vicinity of the opening so as to respectively correspond to the guide grooves.

According to the present invention, when the electronic circuit package is inserted in the rack, a partial region of the opening of the rack is shielded by the package surface plate of the electronic circuit package, and the remaining region of the opening is shielded by the dummy surface plates. When the electronic circuit package is not inserted in the rack, the partial region of the opening of the rack is shielded by the dummy surface plate. Thus, the whole of the opening of the rack is shielded by the package surface plate(s) and/or the dummy surface plate(s). Each dummy surface plate is pivotably supported to the rack, so that when the electronic circuit package is inserted into the rack, the dummy surface plate is pivoted inward of the rack, whereas when the electronic circuit package is removed from the rack, the dummy surface plate is reversely pivoted to shield a part of the opening of the rack. Accordingly, the shielded condition of the opening of the rack is less canceled in exchanging, adding, or removing the electronic circuit package, thereby enough preventing the occurrence of electromagnetic interference and the reduction in cooling efficiency. It is unnecessary to mount and remove any surface plate or blank plate as used in the prior art in exchanging or the like of the electronic circuit package, thereby reducing the number of working steps and improving the working efficiency. Further, the opening portion of the rack is supported by the rod members for pivotably supporting the dummy surface plates. Accordingly, it is unnecessary to mount any reinforcing plate as used in the prior art, thereby avoiding a decrease in number of the electronic circuit packages allowed to be inserted. Thus, the deflection or deformation of the rack can be reliably prevented, and the size reduction of the device can be achieved.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 12A is a partially cutaway, rear elevation of the electronic circuit package in the preferred embodiment;

FIG. 12B is a top plan view of the electronic circuit package shown in FIG. 12A;

FIG. 12C is a partially cutaway, side elevation of the electronic circuit package shown in FIG. 12A;

DETAILED DESCRIPTION OF THE PREFERRED EMBODIMENT

Figure 1:
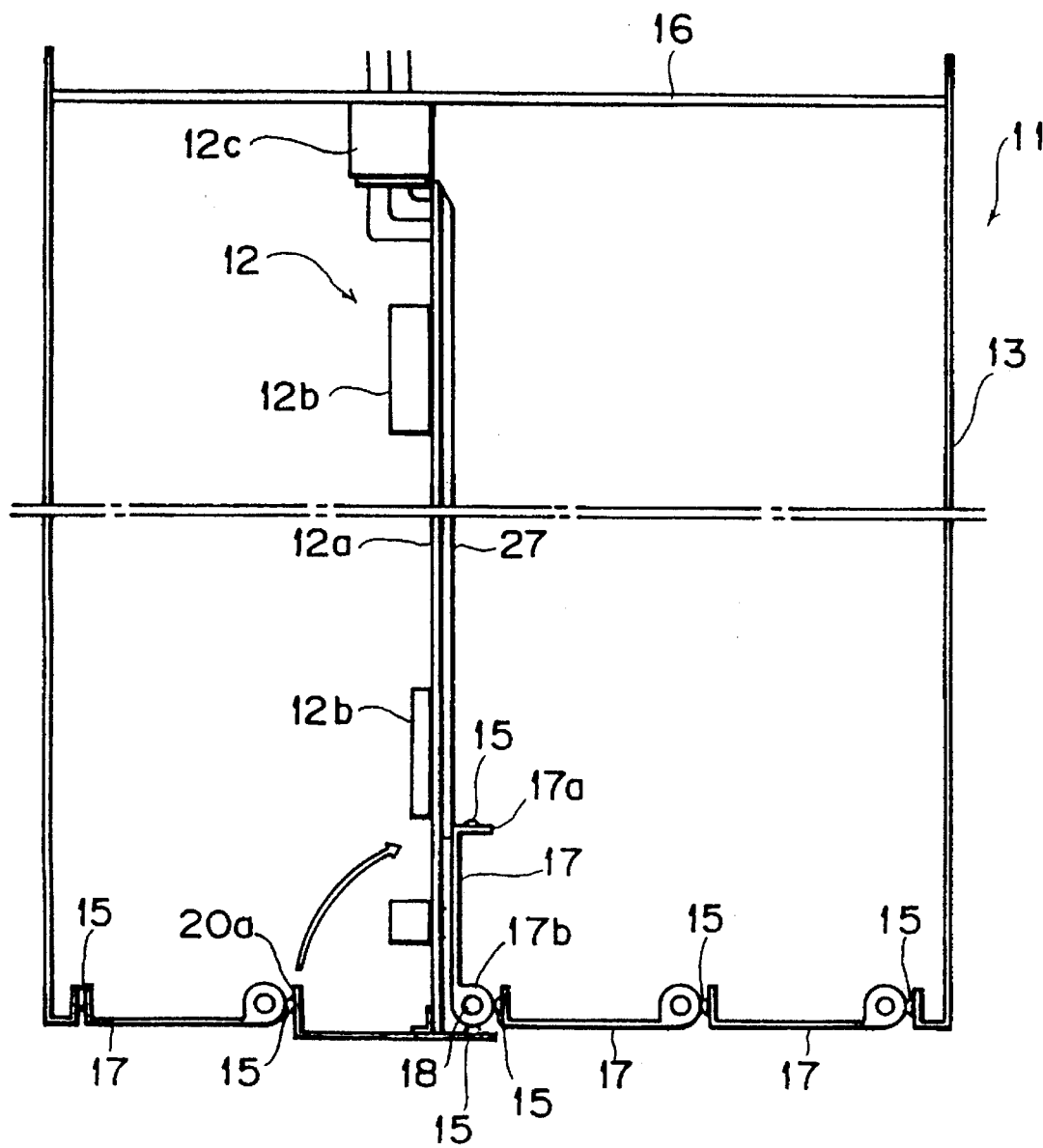
FIG. 1 is a horizontal sectional view of an essential part of a preferred embodiment of the present invention.
Figure 2:
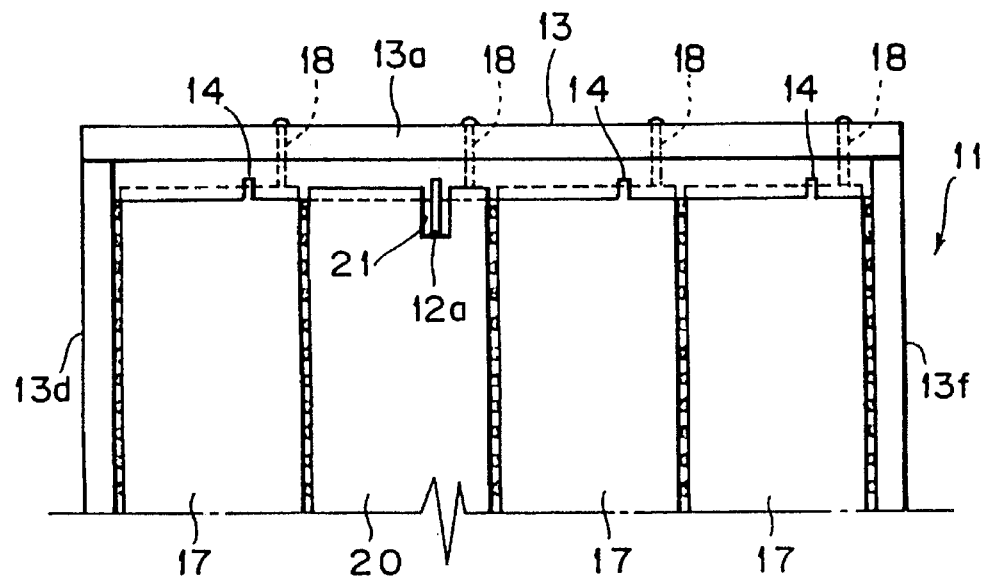
FIG. 2 is a front elevation of the essential part shown in FIG. 1.
Figure 3:
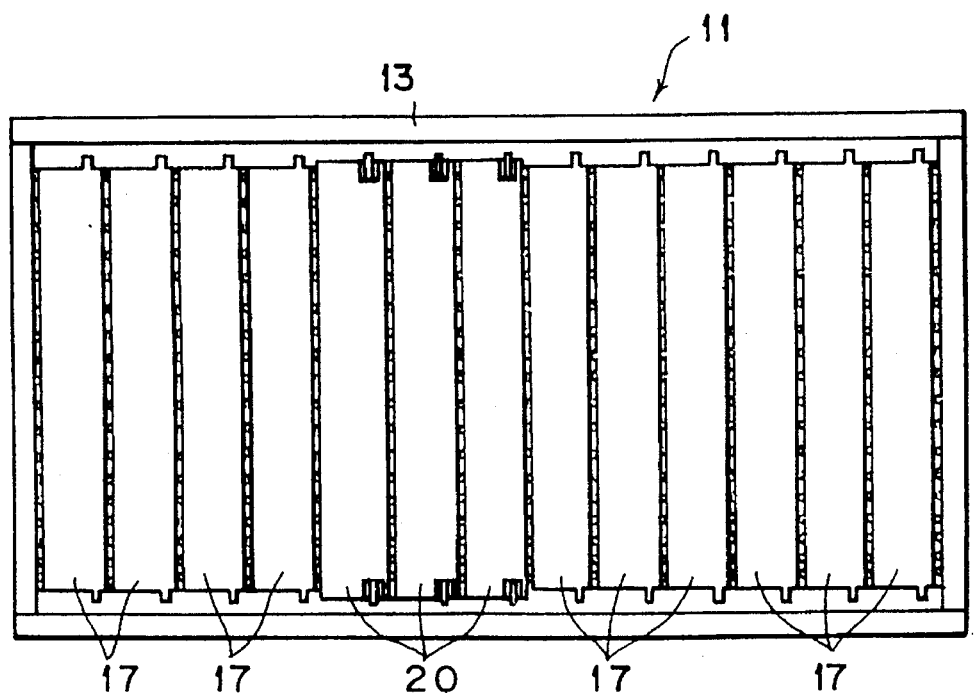
FIG. 3 is a front elevation of the whole of the preferred embodiment.
Figure 4A:
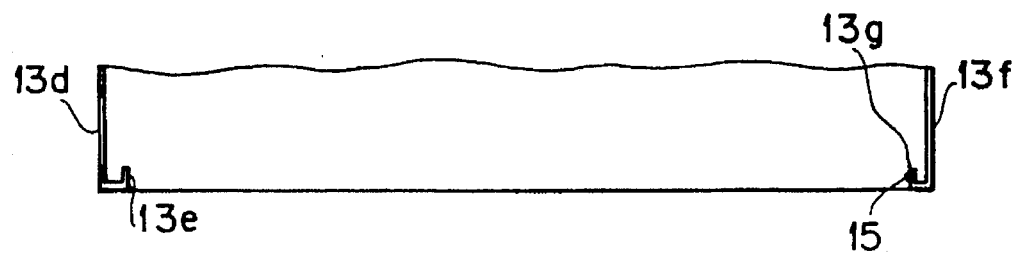
FIG. 4A is a partially cutaway, horizontal sectional view of a rack in the preferred embodiment.
Figure 4B:
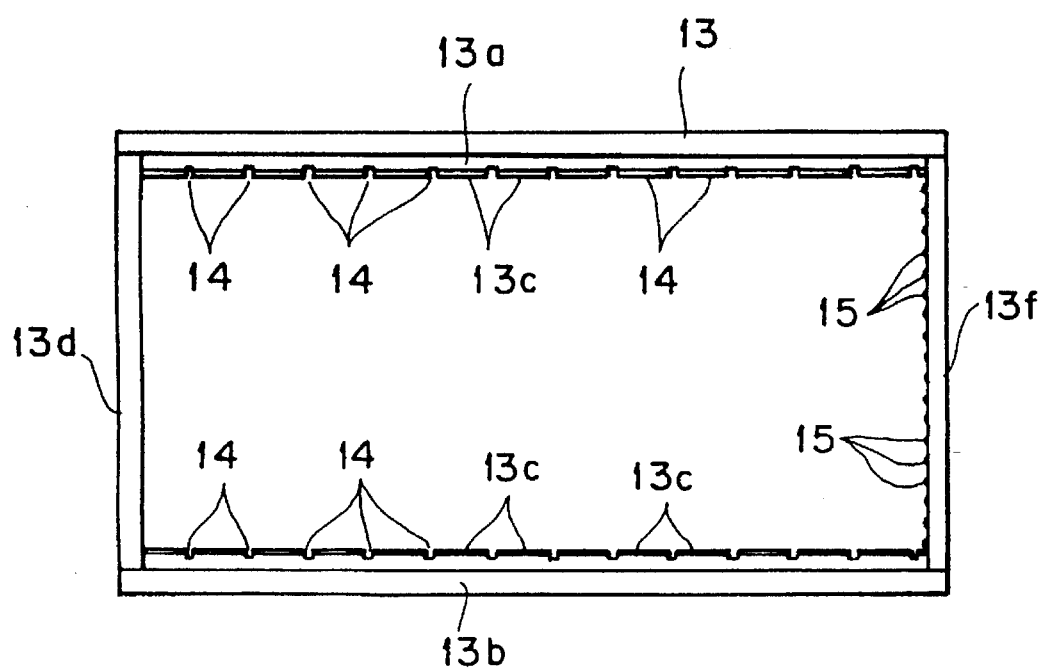
FIG. 4B is a front elevation of the whole of the rack.

A preferred embodiment of the present invention will now be described with reference to the drawings. Referring first to FIGS. 1 to 3, there is shown an electronic device housing 11 for storing a plurality of electronic circuit packages 12 arranged in parallel. Each electronic circuit package 12 is configured by mounting a plurality of electronic components 12b such as ICs and LSIs and a connector 12c on a printed wiring board 12a. Reference numeral 13 denotes a rack forming a part of the electronic device housing 11. As shown in FIGS. 4A and 4B, the rack 13 is configured by mounting panels on a unit frame except a front side thereof. An upper frame 13a and a lower frame 13b of the rack 13 are formed with a plurality of pairs of guide grooves 14. The guide grooves 14 of the upper frame 13a are formed in parallel, and the guide grooves 14 of the lower frame 13b are also formed in parallel in such a manner that the guide grooves 14 in each pair of the upper and lower frames 13a and 13b are opposed to each other. The guide grooves 14 in each pair serve to guide the upper and lower edges of the printed wiring board 12a of each electronic circuit package 12. The rack 13 is formed from a metal plate or the like such as an iron plate plated with nickel or the like, and the surface of the metal plate is coated. However, the outer surfaces and the inner surfaces of edge portions 13c of the upper frame 13a and the lower frame 13b of the rack 13 on the front opening side thereof are not coated, but the metal surface is exposed. Further, a left frame 13d of the rack 13 is formed with an inward bent portion 13e, and a right frame 13f of the rack 13 is also formed with an inward bent portion 13g. The outer surfaces of the bent portions 13e and 13g are not coated, but the metal surface is exposed. A plurality of metal springs 15 for electromagnetic shielding are mounted on the outer surface of the bent portion 13g of the right frame 13f of the rack 13 so as to be arranged at given intervals.

Figure 5A:
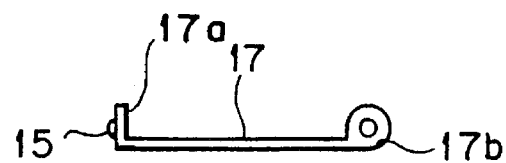
FIG. 5A is a top plan view of a dummy surface plate in the preferred embodiment.
Figure 5B:
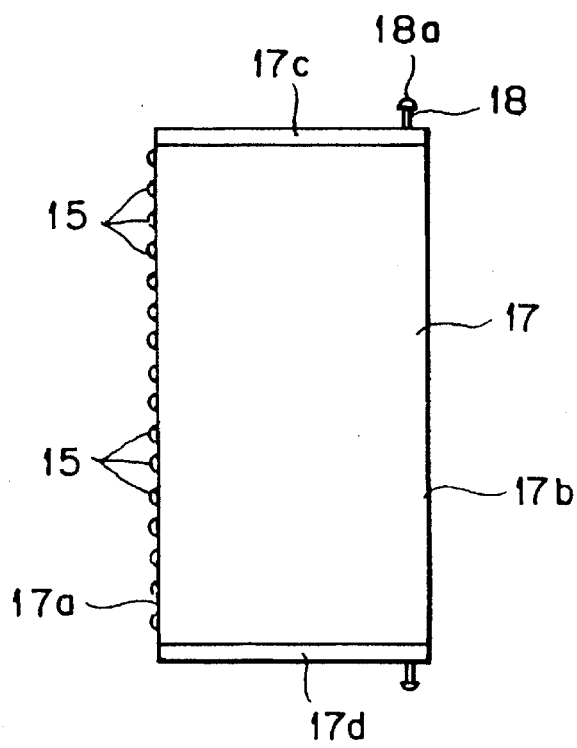
FIG. 5B is a front elevation of FIG. 5A.
Figure 5C:
FIG. 5C is a side elevation of FIG. 5A.

As shown in FIGS. 1 to 3, a back board 16 is mounted on the rear portion of the electronic device housing 11. A plurality of connector pins (not shown) to be engaged with the connector 12c of the electronic circuit package 12 are mounted on the back board 16 so as to be arranged in array. In the following description, a plurality of sections of the electronic device housing 11 into which the electronic circuit packages 12 are inserted will be referred to also as slots. A plurality of dummy surface plates 17 are pivotably mounted in the vicinity of the front opening edge of the rack 13 so as to respectively correspond to the slots. As shown in FIGS. 5A, 5B, and 5C, each dummy surface plate 17 is formed from a metal plate such as an iron plate plated with nickel or the like as similar to the rack 13. One of opposite side edges of the dummy surface plate 17 is formed with a bent portion 17a, and the other side edge of the dummy surface plate 17 is formed with a mounting portion 17b mounted to the rack 13. The outer surfaces of an upper edge portion 17c and a lower edge portion 17d of the dummy surface plate 17, the outer surface of the bent portion 17a, and a part of the outer surface of the mounting portion 17b are not coated, but the metal surface is exposed. A plurality of metal springs 15 for electromagnetic shielding are mounted on the outer surface of the bent portion 17a of the dummy surface plate 17 so as to be arranged at given intervals.

Figure 6:
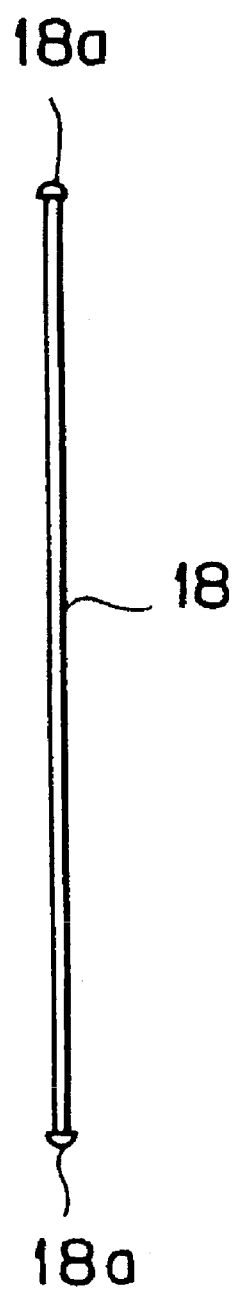
FIG. 6 is an elevational view of a pivot rod for pivotably supporting the dummy surface plate in the preferred embodiment.
Figure 7A:
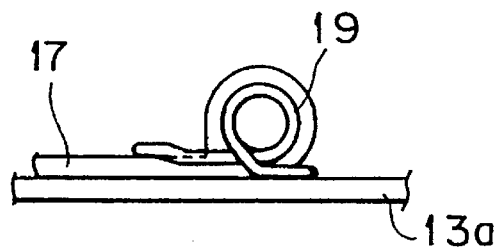
FIG. 7A is a top plan view of a mounting portion of the dummy surface plate and its peripheral portion in the preferred embodiment.
Figure 7B:
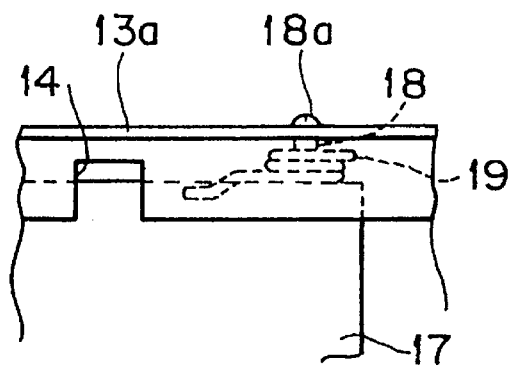
FIG. 7B is a front elevation of FIG. 7A.
Figure 7C:
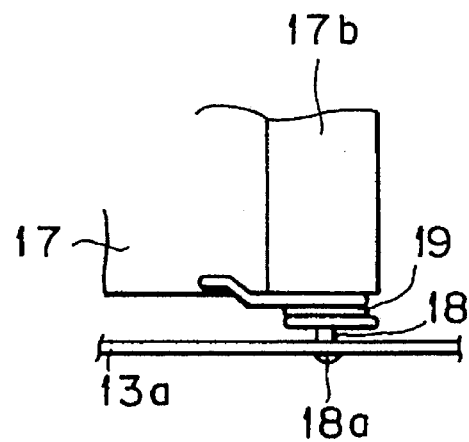
FIG. 7C is a rear elevation of FIG. 7A.

A pivot rod 18 as shown in FIG. 6 is passed through the mounting portion 17b of each dummy surface plate 17. As shown in FIG. 6, the pivot rod 18 is a slender, columnar or cylindrical rod, and it is formed at its upper and lower ends with female screws, which are threadedly engaged with male screws 18a. As shown in FIGS. 7A, 7B, and 7C, the upper and lower end portions of the pivot rod 18 project from the mounting portion 17b of the dummy surface plate 17. A helical spring 19 is placed around each projecting end portion of the pivot rod 18. The pivot rod 18 extends between the upper frame 13a and the lower frame 13b of the rack 13, and is fixed to the rack 13 by engaging the male screws 18a with the female screws of the pivot rod 18 from the outer sides of the upper and lower frames 13a and 13b. Thus, the dummy surface plate 17 is pivotably mounted to the rack 13. The helical spring 19 is fixed at its one end to the upper frame 13a or the lower frame 13b, and the other end of the helical spring 19 is mounted so as to bias the dummy surface plate 17. In the condition where no external force is applied to the dummy surface plate 17, the upper edge portion 17c and the lower edge portion 17d of the dummy surface plate 17 is kept in abutment against the edge portions 13c of the upper frame 13a and the lower frame 13b of the rack 13 from the inside thereof by the biasing force of each helical spring 19. When the dummy surface plate 17 is pushed from the outside of the rack 13 against the biasing force of the each helical spring 19, the plate 17 is pivoted inward about the pivot rod 18.

Figure 8A:
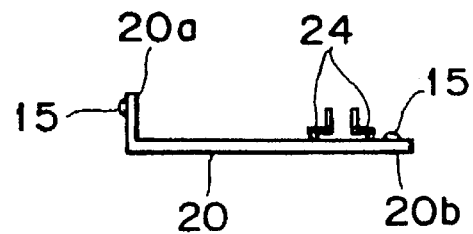
FIG. 8A is a top plan view of a package surface plate in the preferred embodiment.
Figure 8B:
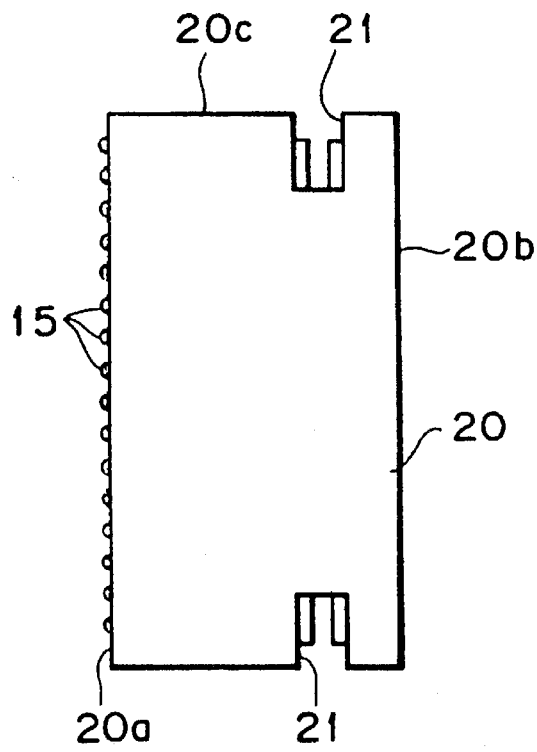
FIG. 8B is a front elevation of FIG. 8A.
Figure 8C:
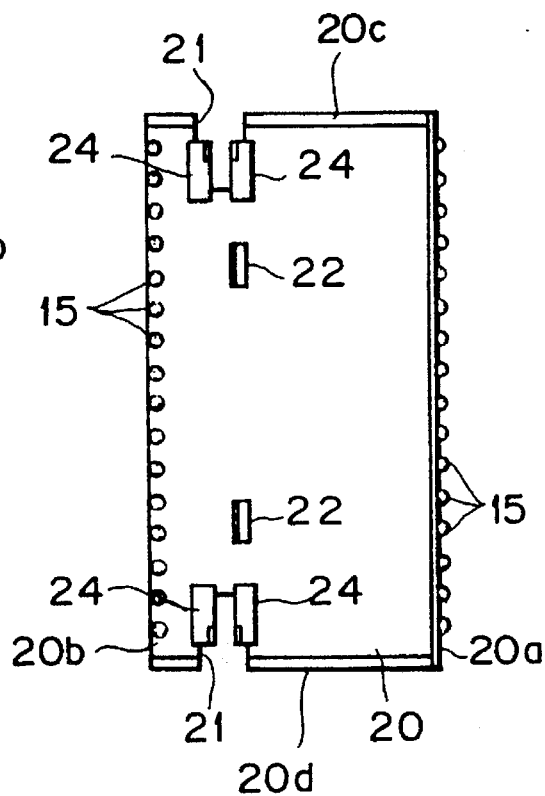
FIG. 8C is a rear elevation of FIG. 8A.
Figure 9A:
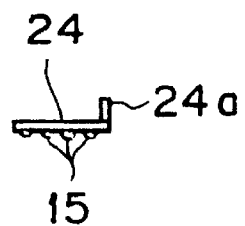
FIG. 9A is a top plan view of a left shield plate for shielding a tool insertion opening in the preferred embodiment.
Figure 9C:
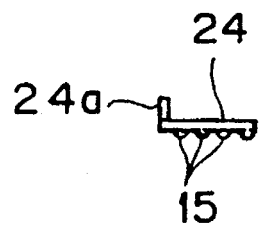
FIG. 9C is a top plan view of a right shield plate for shielding the tool insertion opening in the preferred embodiment.
Figure 9B:
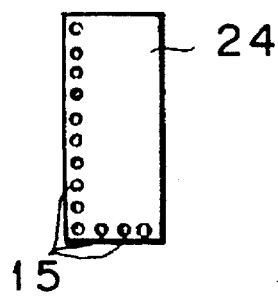
FIG. 9B is a front elevation of FIG. 9A.
Figure 9D:
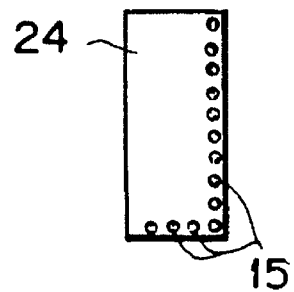
FIG. 9D is a front elevation of FIG. 9C.

As shown in FIGS. 1 and 2, the dummy surface plates 17 are arranged so as to respectively correspond to the slots. Further, the adjacent dummy surface plates 17 are kept in pressure contact with each other through the metal springs 15 for electromagnetic shielding. The leftmost dummy surface plate 17 and the left frame 13d of the rack 13 are kept in pressure contact with each other through the metal springs 15 for electromagnetic shielding. The rightmost dummy surface plate 17 and the right frame 13f of the rack 13 are kept in pressure contact with each other through the metal springs 15 for electromagnetic shielding. Thus, the gap between the adjacent dummy surface plates 17, the gap between the leftmost dummy surface plate 17 and the left frame 13d, and the gap between the rightmost dummy surface plate 17 and the right frame 13f are electromagnetically shielded by the metal springs 15. A package surface plate 20 is mounted on the front end of the printed wiring board 12a of each electronic circuit package 12 opposite to the connector 12c so as to be substantially perpendicular to the printed wiring board 12a. As shown in FIGS. 8A, 8B, and 8C, the package surface plate 20 is formed from a metal plate such as an iron plate plated with nickel or the like as similar to the dummy surface plate 17. One of opposite side edges of the package surface plate 20 is formed with a bent portion 20a. The inner surfaces of an upper edge portion 20c and a lower edge portion 20d of the package surface plate 20, the outer surface of the bent portion 20a, and a part of the inner surface of the plate 20 in the vicinity of a side edge portion 20b opposite to the bent portion 20a are not coated, but the metal surface is exposed. A plurality of metal springs 15 for electromagnetic shielding are mounted on the outer surface of the bent portion 20a and the inner surface of the plate 20 in the vicinity of the side edge portion 20b so as to be arranged at given intervals. The package surface plate 20 is recessed at its upper and lower ends to form a pair of tool insertion openings 21 each for allowing insertion of a tool used to remove the electronic circuit package 12. The package surface plate 20 is fixed to the printed wiring board 12a of the electronic circuit package 12 by two metal fixtures 22 fixed to the rear surface of the plate 20.

Figure 10A:
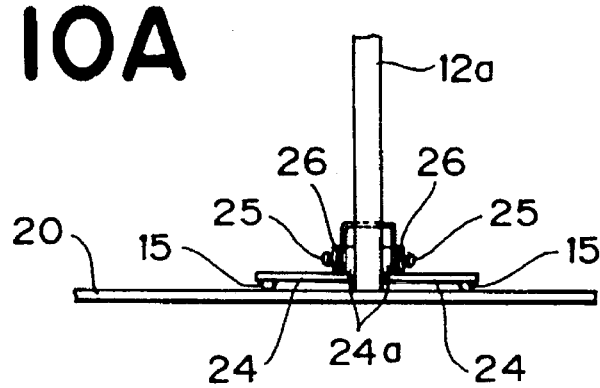
FIG. 10A is a top plan view of the shield plates mounted on the electronic circuit package and their peripheral portion in the preferred embodiment.
Figure 10B:
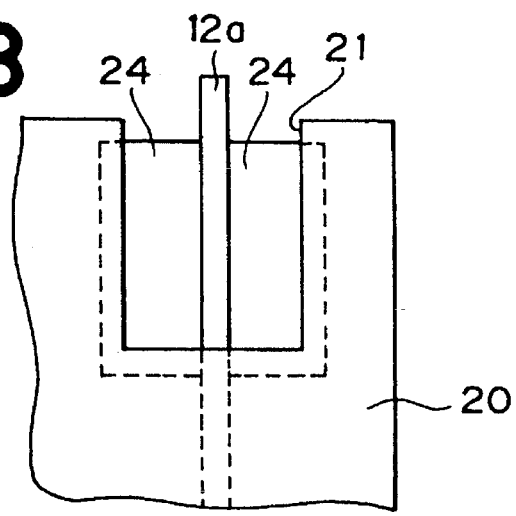
FIG. 10B is a front elevation of FIG. 10A.
Figure 10C:
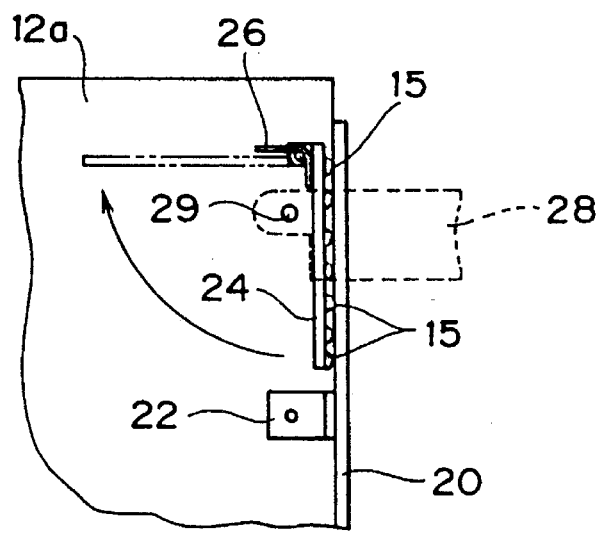
FIG. 10C is a side elevation of FIG. 10A.
Figure 11:
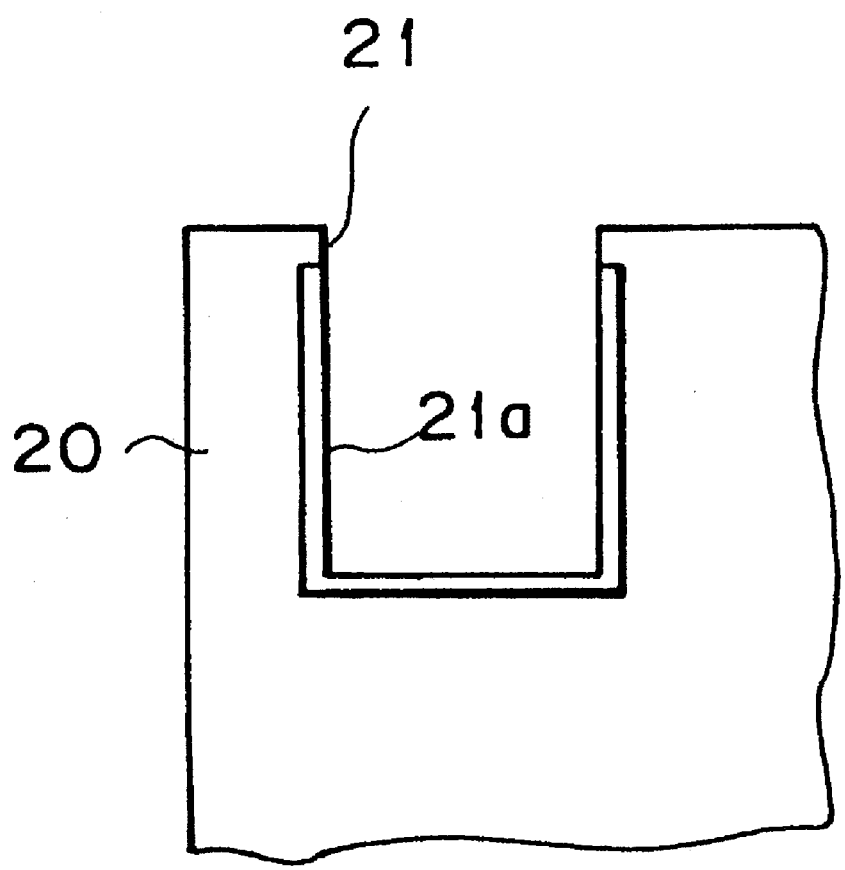
FIG. 11 is a rear elevation of a portion of the package surface plate in the vicinity of the tool insertion opening.
Figure 13:
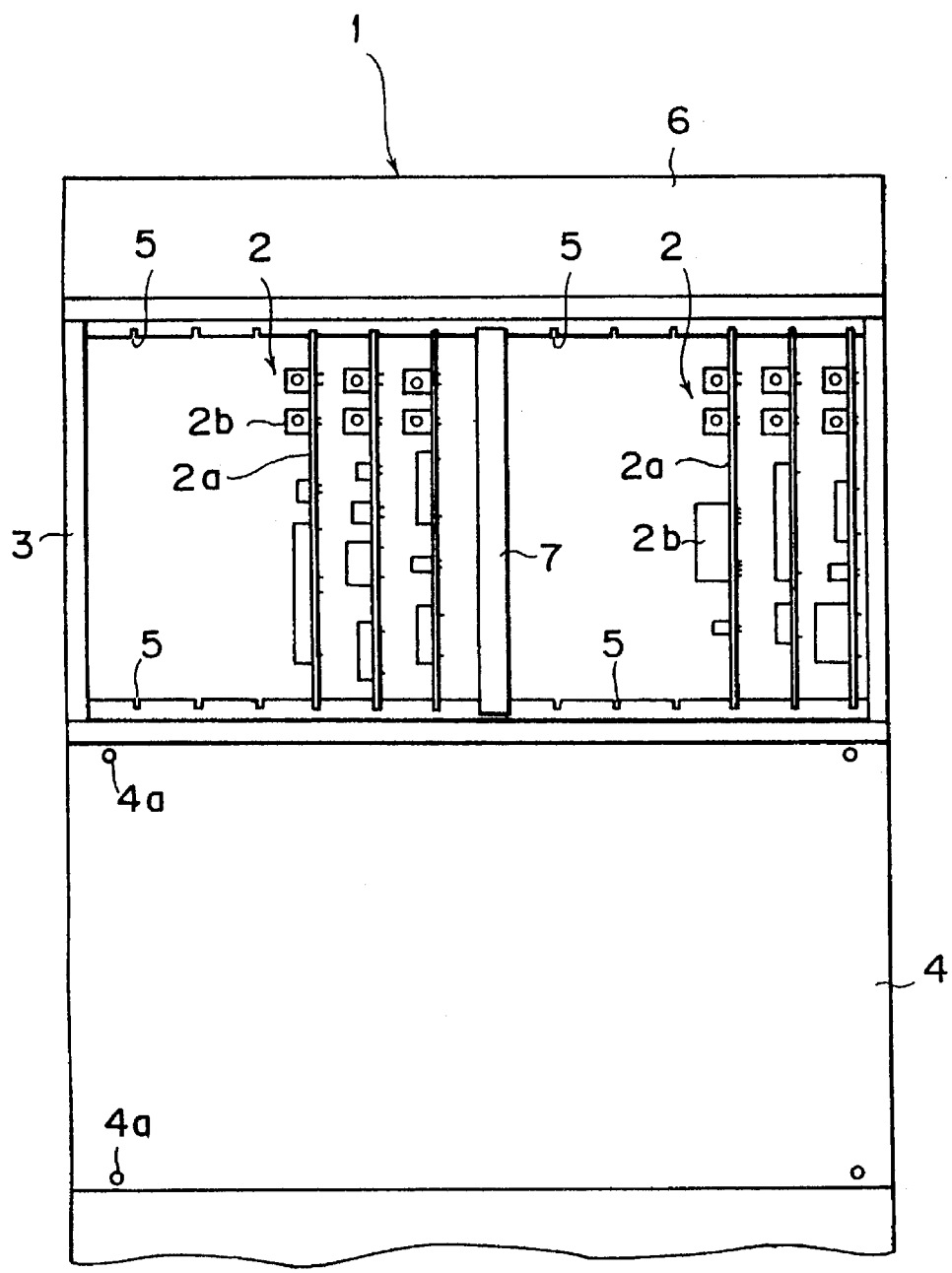
FIG. 13 is a front elevation of an electronic device using a conventional electronic device housing.
Figure 14:
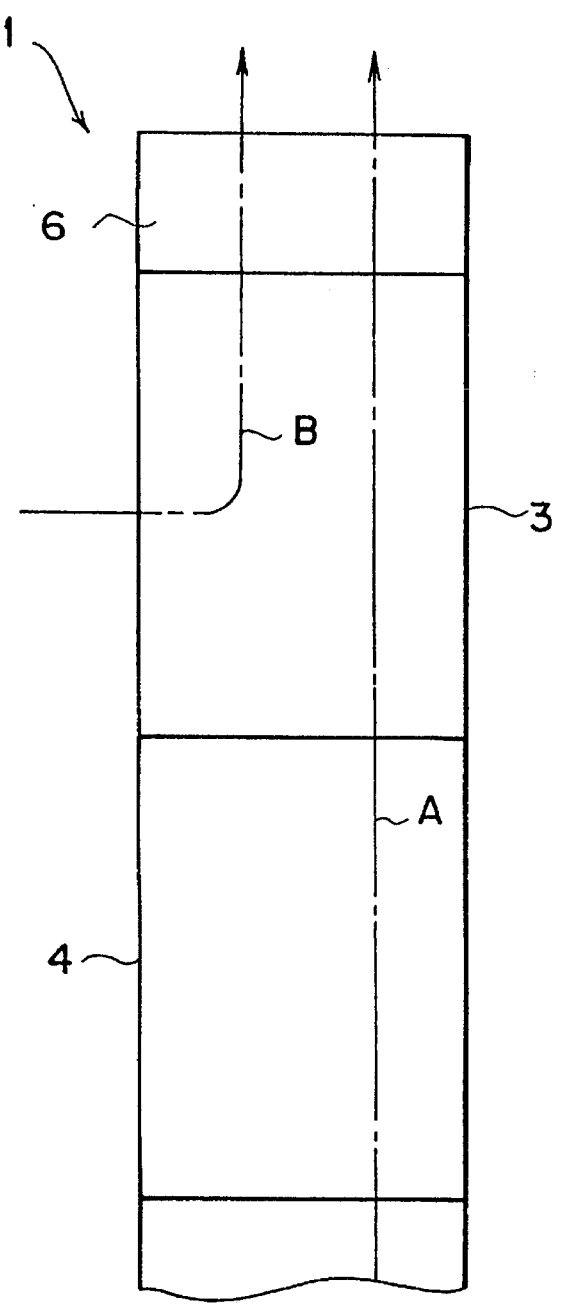
FIG. 14 is a side elevation of FIG. 13.
Figure 15:
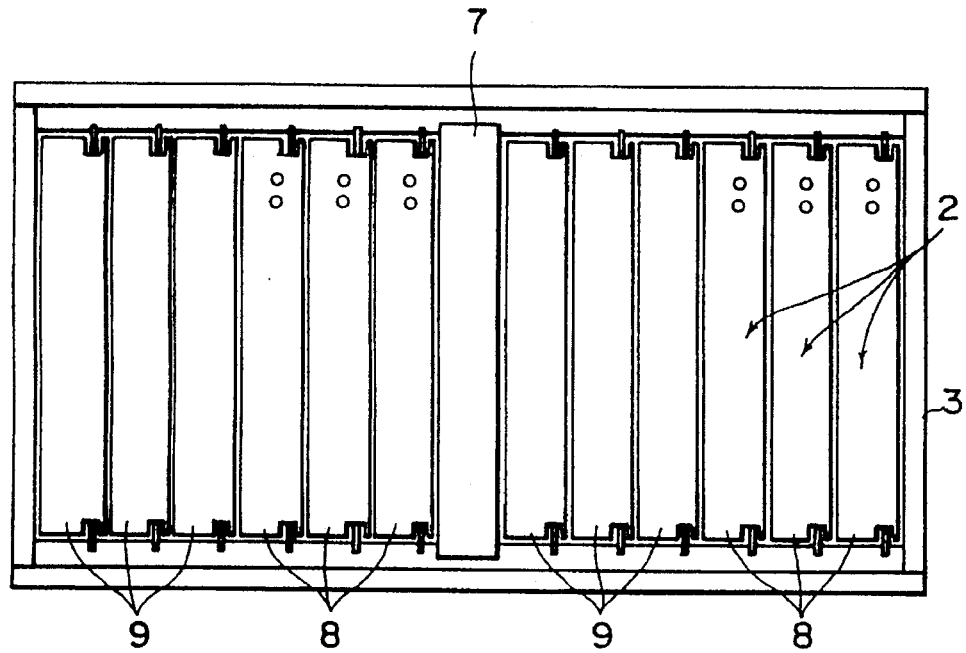
FIG. 15 is a front elevation of an electronic device using another conventional electronic device housing in the condition where blank plates are mounted.
Figure 16:
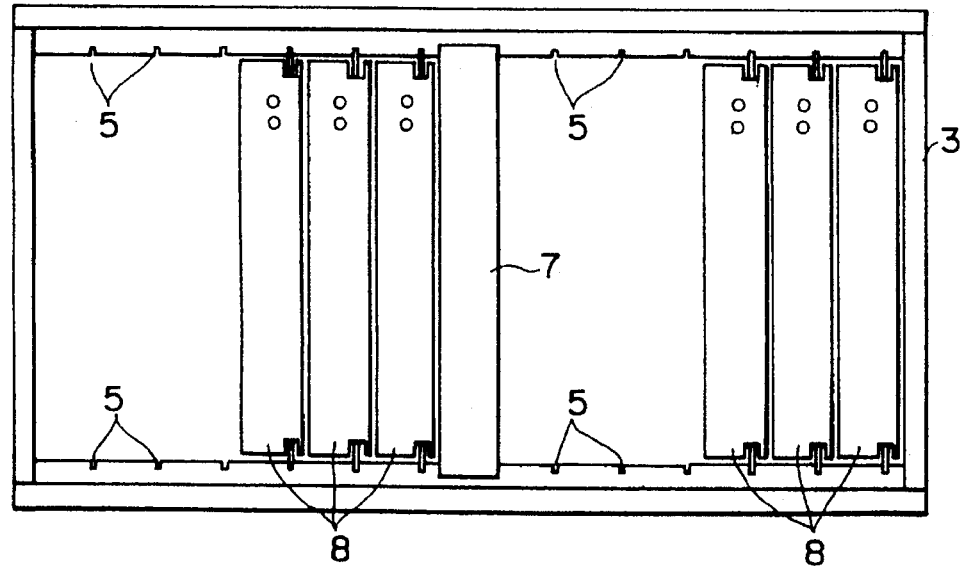
FIG. 16 is a view similar to FIG. 15, showing the condition where the blank plates are removed.

A pair of right and left shield plates 24 for shielding each tool insertion opening 21 of the package surface plate 20 are pivotably mounted in the vicinity of each tool insertion opening 21. As shown in FIGS. 9A, 9B, 9C and 9D, each shield plate 24 is formed from a metal plate such as an iron plate plated with nickel or the like as similar to the package surface plate 20. One of opposite side edges of each shield plate 24 is formed with a bent portion 24a. A plurality of metal springs 15 for electromagnetic shielding are mounted on each shield plate 24 so as to be arranged at given intervals. As shown in FIGS. 10A, 10B, and 10C, each shield plate 24 is pivotably mounted to the printed wiring board 12a in such a manner that the bent portion 24a of each shield plate 24 is supported by a screw 25 fixed to the printed wiring board 12a, and a helical spring 26 is placed around the screw 25. Thus, the outer surface of each shield plate 24 is kept in abutment against the inner surface of the package surface plate 20 through the metal springs 15 for electromagnetic shielding by the biasing force of the helical spring 26, thereby normally shielding each tool insertion opening 21 of the package surface plate 20. One end of each helical spring 26 is fixed to the printed wiring board 12a, and the other end biases the corresponding shield plate 24. In the condition where no external force is applied to each shield plate 24, the outer surface of the plate 24 is kept in abutment against the inner surface of the package surface plate 20 through the metal springs 15 for electromagnetic shielding, thus shielding each tool insertion opening 21. When each shield plate 24 is pushed from the outside of the rack 13, the plate 24 is pivoted inward as shown in FIG. 10C. As shown in FIG. 11, a part 21a of the inner surface of the package surface plate 20 in the vicinity of each tool insertion opening 21 is not coated, but the metal surface is exposed. The metal springs 15 of each shield plate 24 are kept in abutment against the part 21a to thereby electromagnetically shield the gap between each shield plate 24 and the package surface plate 20. As shown in FIGS. 12A, 12B, and 12C, a contact prevention fitting 27 is mounted by screws or the like on the back surface of the printed wiring board 12a of the electronic circuit package 12 opposite to the components mounting surface thereof so as to extend along the upper edge of the printed wiring board 12a from the connector 12c side toward the package surface plate 20 side. The contact prevention fitting 27 may be mounted so as to extend along the lower edge of the printed wiring board 12a.

In mounting the electronic circuit package 12 into the electronic device housing 11, the dummy surface plate 17 is pushed by the electronic circuit package 12 with the connector 12c facing the dummy surface plate 17, and the electronic circuit package 12 is inserted into the corresponding slot of the electronic device housing 11 with the upper and lower edges of the printed wiring board 12a of the electronic circuit package 12 being guided by the upper and lower guide grooves 14. At this time, the dummy surface plate 17 is pivoted 90° in the direction shown by an arrow in FIG. 1 by the force of insertion of the electronic circuit package 12. At the end of insertion, the connector 12c on the printed wiring board 12a is engaged with the back board 16, thus completing the mounting operation of the electronic circuit package 12. In this condition, the dummy surface plate 17 having shielded the front opening of the slot is replaced in position by the package surface plate 20 of the electronic circuit package 12 inserted in the slot, so that the metal springs 15 on the bent portion 20a of the package surface plate 20 come into pressure contact with the left adjacent dummy surface plate 17, and the metal springs 15 in the vicinity of the side edge portion 20b of the package surface plate 20 come into pressure contact with the mounting portion 17b of the pivoted dummy surface plate 17, thus electromagnetically shielding the gap between the package surface plate 20 and the left adjacent dummy surface plate 17 and the gap between the package surface plate 20 and the pivoted dummy surface plate 17. In removing the electronic circuit package 12 from the electronic device housing 11, the front end of a tool 28 used to remove the electronic circuit package 12 is inserted into each tool insertion opening 21 of the package surface plate 20 as shown in FIG. 10C to push the shield plates 24 shielding each tool insertion opening 21 and inward pivot them. Then, the front end of the tool 28 is engaged with an engagement portion 29 formed on the printed wiring board 12a, and the tool 28 is drawn to remove the electronic circuit package 12. Accordingly, the connector 12c of the electronic circuit package 12 is disengaged from the back board 16. In this condition, the electronic circuit package 12 is fully removed from the slot of the electronic device housing 11. At this time, the dummy surface plate 17 having been pressed by the electronic circuit package 12 is reversely pivoted 90° by the biasing force of the helical springs 19 to restore an original position. Thus, the removing operation is completed. In this condition, the package surface plate 20 having shielded the front opening of the slot is replaced in position by the dummy surface plate 17, so that the metal springs 15 on the bent portion 17a of the dummy surface plate 17 come into pressure contact with the left adjacent dummy surface plate 17, thereby electromagnetically shielding the gap between the operated dummy surface plate 17 and the left adjacent dummy surface plate 17. Further, the metal springs 15 on the bent portion 17a of the right adjacent dummy surface plate 17 are kept in pressure contact with the mounting portion 17b of the operated dummy surface plate 17 irrespective of the pivotal movement thereof, thereby electromagnetically shielding the gap between the operated dummy surface plate 17 and the right adjacent dummy surface plate 17.

According to this preferred embodiment, in inserting or removing the electronic circuit package 12, the operation for removing or mounting a blank plate as used in the prior art can be eliminated. Accordingly, the number of steps of the operation can be greatly reduced, and the operation can be completed with great simplicity. Further, the operation for exchange or the like of the electronic circuit package 12 can be completed in a very short time, and the shielded condition can be less canceled in the operation for exchange or the like of the electronic circuit package 12, thereby greatly reducing the occurrence of electromagnetic interference and the reduction in cooling efficiency. Furthermore, the opening portion of the rack 13 is supported by the plural pivot rods 18 vertically extending over the height of the rack 13, for supporting the dummy surface plates 17. Accordingly, the deflection or deformation of the electronic device housing 11 can be prevented. Since any special supports like a reinforcing plate used in the prior art are not required, the problem of decrease in number of the electronic circuit packages allowed to be inserted can be eliminated, and the size reduction or the high-density mountability of the device can be achieved. Furthermore, the metal springs 15 for electrically connecting the dummy surface plates 17, the package surface plates 20, and the rack 13 are present in the gaps between the opposed portions of these members 17, 20, and 13, or the members 17, 20, and 13 are in contact with each other in a partially overlapping condition. Accordingly, the electromagnetic shielding of the electronic device housing 11 can be improved to thereby reduce the occurrence of electromagnetic interference during normal operation. In addition, the shield plates 24 designed to be pivoted by a pushing force are so mounted as to shield each tool insertion opening 21 of the package surface plate 20, and the shield plates 24 are normally kept in pressure contact with the package surface plate 20 through the metal springs 15. Accordingly, the leakage of electromagnetic wave from each tool insertion opening 21 can be prevented, and the tool can also be inserted very easily. In general, leads of the electronic components project from the back surface of the electronic circuit package 12 opposite to the components mounting surface thereof. Accordingly, if the dummy surface plate 17 comes into contact with the leads of the electronic components of the electronic circuit package 12 inserted into the slot, there may occur a problem of short-circuit. To avoid this problem, this preferred embodiment employs the contact prevention fitting 27 mounted on the back surface of the printed wiring board 12a of the electronic circuit package 12. That is, when the electronic circuit package 12 is inserted into the slot, the dummy surface plate 17 pushed by the electronic circuit package 12 comes into contact with the contact prevention fitting 27, thereby ensuring a sufficient space between the leads of the electronic components and the dummy surface plate 17. Accordingly, the problem of short-circuit causing breakdown or the like of the electronic circuit package 12 can be eliminated.

As described above, according to the present invention, it is possible to provide an electronic device housing which can enough prevent the occurrence of electromagnetic interference and the reduction in cooling efficiency when the need for exchange or the like of the electronic circuit package arises during the operation of the device. Further, it is possible to provide an electronic device housing which can improve the efficiency of working such as exchanging of the electronic circuit package and can reliably prevent the deflection or deformation of the housing without hindering the size reduction of the device.

What is claimed is:

1. An electronic device housing for storing a plurality of electronic circuit packages, comprising:

a box-shaped rack having a plurality of guide grooves for guiding opposite side edges of said electronic circuit packages, and having an opening for allowing insertion and removal of said electronic circuit packages;

a package surface plate mounted on each of said electronic circuit packages, for shielding a partial region of said opening of said rack when one of said electronic circuit packages is inserted into said rack as being guided by said guide grooves; and a plurality of dummy surface plates pivotably mounted on said rack, each of said dummy surface plates being pivoted inward of said rack by a pushing force applied to said dummy surface plate from one of said electronic circuit packages when said electronic circuit package is inserted into said rack as being guided by said guide grooves, whereas each of said dummy surface plates being pivoted so as to shield said partial region of said opening of said rack having been closed by said package surface plate when said electronic circuit package is removed from said rack as being guided by said guide grooves.

2. An electronic device housing according to claim 1, further comprising a plurality of rod members mounted to said rack in the vicinity of said opening so as to respectively correspond to said guide grooves, for respectively pivotably supporting said dummy surface plates.

3. An electronic device housing according to claim 1, further comprising a plurality of conductive elastic members mounted on each of said dummy surface plates, for electromagnetically shielding a gap between said dummy surface plates adjacent to each other or a gap between one of said dummy surface plates and said rack.

4. An electronic device housing according to claim 1, further comprising a plurality of conductive elastic members mounted on said rack, for electromagnetically shielding a gap between said rack and one of said dummy surface plates or a gap between said rack and said package surface plate.

5. An electronic device housing according to claim 1, further comprising a biasing member for biasing each of said dummy surface plates so that when one of said electronic circuit packages is removed from said rack, said dummy surface plate having been pressed by said electronic circuit package comes into abutment against an inner surface of a part of said rack to thereby electromagnetically shield a gap between said dummy surface plate and said rack.

6. An electronic device housing according to claim 1, further comprising a contact prevention member mounted on each of said electronic circuit package, for preventing one of said dummy surface plates from coming into contact with said electronic circuit package having pushed said dummy surface plate and inserted into said rack.

7. An electronic device housing according to claim 1, wherein said package surface plate has a tool insertion opening for allowing insertion of a tool used to remove each of said electronic circuit packages; and a shield plate for shielding said tool insertion opening is pivotably mounted on said package surface plate, said shield plate being biased by a biasing member so that when said tool is inserted from said tool insertion opening into said rack, said shield plate is pivoted inward of said rack by a pushing force applied from said tool to said shield plate, whereas when said tool is not inserted, said shield plate shields said tool insertion opening.

8. An electronic device housing according to claim 7, further comprising a plurality of conductive elastic members mounted on said shield plate, for electromagnetically shielding a gap between said shield plate and said package surface plate.

* * * * *